United States Patent [19]

Hasler

[11] Patent Number: 5,150,416
[45] Date of Patent: Sep. 22, 1992

[54] ELECTRONIC LEVEL CONTROL CIRCUIT FOR SOUND SIGNALS

[75] Inventor: Rudolf Hasler, Vienna, Austria

[73] Assignee: U.S. Philips Corp., New York, N.Y.

[21] Appl. No.: 563,474

[22] Filed: Aug. 6, 1990

[30] Foreign Application Priority Data

Sep. 28, 1989 [AT] Austria .................. 2265/89

[51] Int. Cl.⁵ .................. H03G 3/00; H03G 5/00; H03G 3/10; H03F 3/18
[52] U.S. Cl. .................. 381/104; 381/98; 330/264; 330/285
[58] Field of Search .............. 381/104, 107, 108, 109, 381/28, 98; 330/264, 306, 285; 331/116 R, 111; 307/304, 290

[56] References Cited

U.S. PATENT DOCUMENTS

| | | |
|---|---|---|
| 3,725,583 | 4/1973 | Gunderson et al. |
| 3,769,459 | 10/1973 | Niffenegger et al. |
| 3,904,988 | 9/1975 | Hsiao ........................... 331/111 |
| 3,914,705 | 10/1975 | Takahashi ..................... 381/104 |
| 4,069,431 | 1/1978 | Kucharewski ................ 307/290 |
| 4,229,668 | 10/1980 | Ebihara et al. ............... 307/304 |
| 4,345,502 | 8/1982 | Jahns ............................ 330/264 |
| 4,483,016 | 11/1984 | Hochstein .................... 330/264 |
| 4,791,382 | 12/1988 | Shiomi ......................... 330/264 |
| 4,918,408 | 4/1990 | Sakihama et al. ............ 331/116 R |

Primary Examiner—James L. Dwyer
Assistant Examiner—Jack Chiang
Attorney, Agent, or Firm—Steven R. Biren

[57] ABSTRACT

A circuit arrangement (12, 13) for the electronic level control of a sound signal includes an amplifier circuit (14), the gain of which can be controlled in dependence on a variable direct control voltage, and a voltage-adjusting stage (15) for generating the variable direct control voltage. The amplifier circuit is formed by a CMOS inverter (14), of which the supply voltage connection (21), is supplied with the variable direct control voltage, generated by the voltage-adjusting stage (15), as supply voltage for the CMOS inverter (14). The CMOS inverter (14) is operated, in dependence on the direct control voltage, below the knee-point voltage in its starting region in which the gain of the CMOS inverter (14) decreases, and additionally the dynamic output impedance of the CMOS inverter (14) increases, with decreasing direct control voltage.

4 Claims, 1 Drawing Sheet

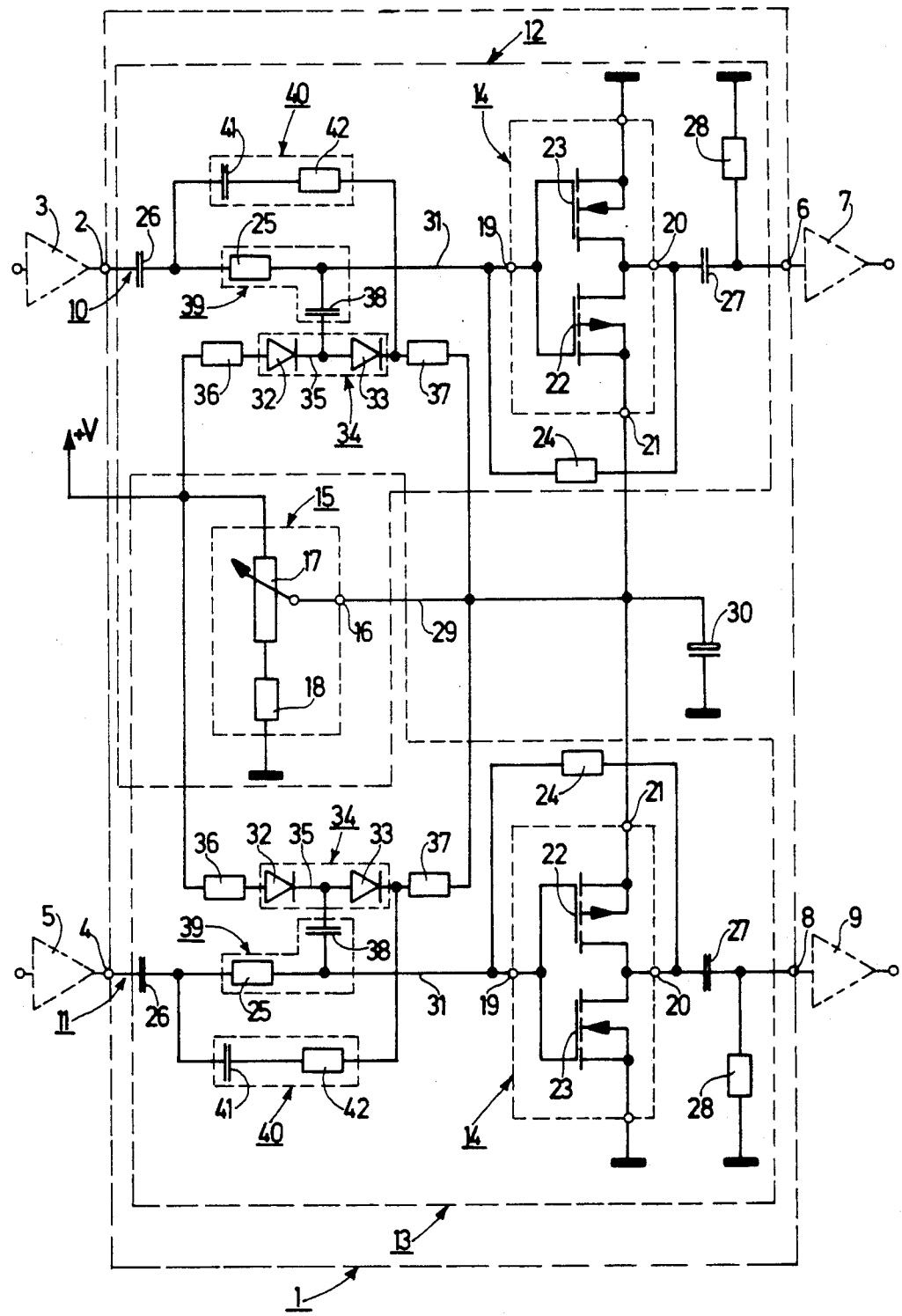

ELECTRONIC LEVEL CONTROL CIRCUIT FOR SOUND SIGNALS

BACKGROUND OF THE INVENTION

The invention relates to a circuit arrangement for the electronic level control of a sound signal, comprising an amplifier circuit which is inserted into a sound signal path and the gain of which can be controlled in dependence on a variable direct control voltage, and with a voltage-adjusting stage for generating the variable direct control voltage, from the output of which the variable direct control voltage generated is supplied to the amplifier circuit for controlling its gain.

Such a circuit arrangement is known, for example, from DE-AS 2,136,247. In this known circuit arrangement, the amplifier circuit exhibits a differential amplifier consisting of two bipolar transistors and the voltage-adjusting stage is formed by a variable resistance element which is connected to a direct voltage source and by means of which a direct control voltage is generated which is supplied to the base of a third bipolar transistor of the amplifier circuit, which forms a current source for the two transistors of the differential amplifier and which, in dependence on the direct control voltage supplied to its base, controls the current supplied by it to the two transistors of the differential amplifier and thus the signal coupling between these two transistors. In this known circuit arrangement, the entire range of adjustment of the differential amplifier for controlling the level or adjusting the level, respectively, of a sound signal is achieved by means of relatively small changes of the direct control voltage as a result of which, however, there is a relatively large dependence of the adjustment characteristic of the differential amplifier on tolerances of the components and voltage values and on thermal influences.

Furthermore, relatively high voltages and relatively high currents are required for achieving the most optimum adjustment characteristic of the differential amplifier in this known circuit arrangement. For the case where the known circuit arrangement is used for the level control or level adjustment, respectively, of stereo signals, in which case, as can be seen from DE-AS 2,136,247, such a differential amplifier is then provided in each of the two stereo channels, there is furthermore the problem that due to the aforementioned tolerance- and temperature-dependence, the same adjustment effect for level control or level adjustment, respectively, can only be achieved with great difficulty over the entire adjustment range for both stereo channels.

SUMMARY OF THE INVENTION

It is the object of the invention to avoid the aforementioned difficulties and to develop a circuit arrangement of the generic type initially specified, in such a manner that it exhibits both a simple circuit configuration and a relatively large adjustment range and that the entire adjustment range achieved by means of the amplifier circuit is achieved by means of a relatively large change of the direct control voltage and the best possible adjustment characteristic of the amplifier circuit is obtained with relatively small supply voltages and small currents. For this purpose, the invention is characterized by the fact that the amplifier circuit is formed by a CMOS inverter having a signal input, a signal output and a supply voltage connection, the signal input of which is preceded by a series resistor via which the sound signal, the level of which is to be controlled, is supplied to the signal input of the CMOS inverter, and from the signal output of which the level-controlled sound signal is picked up and the supply voltage connection of which is supplied with the variable direct control voltage, generated by means of the voltage-adjusting stage, as supply voltage for the CMOS inverter, the CMOS inverter being operated, in dependence on the direct control voltage supplied to the supply voltage connection, below the knee-point voltage in its starting region in which the gain of the CMOS inverter decreases, and additionally the dynamic output impedance of the CMOS inverter increases with decreasing direct control voltage.

The circuit arrangement according to the invention has the result that, in dependence on the variable direct control voltage which is supplied as supply voltage to the CMOS inverter provided as amplifier circuit, both the gain of the CMOS inverter and the dynamic output impedance of the CMOS inverter are variable, in such a manner that the gain decreases with decreasing direct control voltage and the dynamic output impedance increases. Together with a load impedance connected to the output of the CMOS inverter, the dynamic output impedance of the CMOS inverter forms a voltage divider for the level-controlled sound signal, which supplies a sound signal, the level of which decreases with increasing dynamic output impedance due to the changing voltage divider ratio. Furthermore, the CMOS inverter also supplies a sound signal the level of which decreases with decreasing direct control voltage due to the fact that the gain decreases with decreasing direct control voltage. Thus, in the circuit arrangement according to the invention, two effects which are superimposed in the same direction are influential in controlling or adjusting, respectively, the level of a sound signal, namely the change in the gain of the CMOS inverter which is directly proportional to the change of the direct control voltage supplied to the CMOS inverter and the change in the dynamic output impedance of the CMOS inverter which is inversely proportional to the change in the direct control voltage supplied to the CMOS inverter. In this manner, a relatively large adjustment range is achieved in the electronic control or adjustment, respectively, of the level of a sound signal by particularly simple means, namely by only a single CMOS inverter which is operated below the knee-point voltage in its starting region. Due to the fact that a CMOS inverter is used, the direct control voltage can be changed within a relatively wide range for controlling the level of a sound signal because of the characteristics of this inverter in its starting region, which is advantageous with respect to a low influence of tolerances and thermal influences on the adjustment characteristic. The result of operating the CMOS inverter below the knee-point voltage in its starting region is furthermore advantageously that sufficiency is found with low direct control voltages which are supplied to the CMOS inverter as supply voltage and that only very small currents occur. A further advantage of using a CMOS inverter which is operated below the knee-point voltage in its starting region consists in the fact that a linear change of the direct control voltage results in a logarithmic change in the output signal of the CMOS inverter, that is to say in the level-controlled sound signal as is desirable for correct volume control matched to the logarithmic auditory sensitivity of the ear. Furthermore, due to the low tolerance- and temperature-dependence of such CMOS inverters, the same adjustment characteristic over the entire adjustment range, that is to say good tracking, is obtained for both stereo channels for the case where the circuit arrangement according to the invention is used for the electronic level control or level adjustment, respectively, of stereo signals, such a CMOS inverter then being provided in each of the two stereo channels.

With respect to achieving as large an adjustment range as possible, it has been found to be particularly advantageous if a dynamic impedance, which is essentially formed by two series-connected diodes the impedance value of which is controlled and is connected to the connection between the series resistor and the signal input of the CMOS inverter, the connection between the series resistor and the signal input of the CMOS inverter being connected to the connection between the two diodes of the dynamic impedance, which, together with the series resistor, forms a voltage divider for the sound signal, the level of which is to be controlled and which is supplied to the CMOS inverter, and the variable direct control voltage generated by means of the voltage-adjusting stage is supplied at a connection of one diode to the dynamic impedance formed by the two diodes, for controlling the impedance value of the latter, the impedance value of the dynamic impedance decreasing with decreasing direct control voltage. The result of this is that the voltage divider ratio between the series resistor and the dynamic impedance, the impedance value of which can be controlled and which is formed by the two diodes, changes with decreasing direct control voltage in such a manner that a decrease in the level of the sound signal supplied to the signal input of the CMOS inverter is achieved. Thus, an additional effect for controlling the level of a sound signal is obtained by also very simple further means, namely essentially by means of two diodes, which effect is superimposed in the same direction on the two aforementioned effects, namely the decrease in gain and the increase in dynamic output impedance of the CMOS inverter with decreasing direct control voltage, as a result of which the adjustment range in the electronic control or adjustment, respectively, of the level of a sound signal is further increased. Provision of the two diodes additionally offers the advantage that overdriving of the CMOS inverter with decreasing direct control voltage, which is supplied as supply voltage for the CMOS inverter to its supply voltage connection, is prevented. By providing two such series-connected diodes the advantageous result is furthermore obtained that the dynamic impedance remains essentially constant independently of the signal amplitude of the sound signal present at the diodes.

Furthermore, it has been found to be advantageous if the connection between the series resistor and the signal input of the CMOS inverter and the connection between the two diodes of the dynamic impedance are connected via a capacitor which, together with the series resistor, forms a high-pass filter via which mid-range and treble signal components of a sound signal, the level of which is to be controlled, are supplied to the dynamic impedance for damping these signal components. The result of this is that at low volumes—which are set by reducing the direct control voltage to low voltage values, when the dynamic impedance then exhibits a low impedance value—mid-range and treble signal components are lowered in relation to bass signal components, which corresponds to a relative raising of the bass signal components as a result of which a good physiological loudness control is achieved with respect to bass signal components.

In this connection, it has been found to be particularly advantageous if the connection of the series resistor facing away from the signal input of the CMOS inverter is connected to one connection of a further high-pass filter, the other connection of which is connected to at least one diode of the dynamic impedance at the connection of the diode facing away from the connection between the two diodes, in which arrangement treble signal components of a sound signal, the level of which is to be controlled, are additionally supplied to the signal input of the CMOS inverter for raising these treble signal components, with partial bypassing of the series resistor via the further high-pass filter and the diode of the dynamic impedance connected to the latter and the capacitor provided between the connection between the two diodes and the connection between the series resistor and the signal input of the CMOS inverter. The result of this is that at low volumes—which are set by reducing the direct control voltage to low voltage values, when the dynamic impedance 34 then exhibits a low impedance value—the treble signal components are also raised in addition to the aforementioned raising of the bass signal components, as a result of which a particularly good physiological loudness control is achieved.

BRIEF DESCRIPTION OF THE DRAWINGS

In the text which follows, the invention will be described in more detail with reference to an illustrative embodiment shown in the drawing to which, however, it will not be restricted. The single FIGURE shows a circuit arrangement for the electronic level control of a stereo sound signal, a circuit arrangement according to the invention for the electronic level control of a sound signal being provided in each of the two stereo channels.

DESCRIPTION OF THE PREFERRED EMBODIMENT

The FIGURE shows a circuit arrangement 1 for the electronic level control or level adjustment, respectively, of a stereo sound signal which exhibits a first input connection 2 which is supplied, for example, with the sound signal, the level of which is to be controlled, of the left-hand channel from a first preamplifier 3, which is indicated diagrammatically, and which exhibits a second input connection 4 which is supplied, for example, with a sound signal, the level of which is to be controlled, of the right-hand channel from a second preamplifier 5 which is indicated diagrammatically. The circuit arrangement 1 furthermore exhibits a first output connection 6 from which the level-controlled sound signal of the left-hand channel is supplied, for example, to a diagrammatically indicated first output stage amplifier 7, and a second output connection 8 from which the level-controlled sound signal of the right-hand channel is supplied, for example, to a diagrammatically indicated second output stage amplifier 9. In each of the two stereo channels 10 and 11, a circuit arrangement 12 and 13, respectively, is provided for the electronic level control or level adjustment, respectively, of the relevant sound signal. These two circuit arrangements 12 and 13 exhibit a completely identical circuit configuration as a result of which the components of the latter are designated by the same reference symbols for the sake of simplicity.

The circuit arrangement 12 or 13 for the electronic level control of a sound signal exhibits an amplifier circuit 14, which is inserted into the sound signal path, that is to say into the stereo channel 10 and 11, respectively, the gain of which can be controlled in dependence on a variable direct control voltage. For generating the variable direct control voltage, a voltage-adjusting stage 15 is provided from the output 16 of which the variable direct control voltage generated is supplied to the amplifier circuit 14 for controlling its gain.

The voltage-adjusting stage 15 exhibits a potentiometer 17 which is connected, on the one hand, to a supply voltage connection +V and, on the other hand, to a reference potential, namely ground potential, via a low-end resistor 18. The slider of the potentiometer 17 is connected to the output 16 of the voltage-adjusting stage 15. Provision of the low-end resistor 18 has the result that the direct control voltage generated by means of the voltage-adjusting stage 15 and occurring at output 16 cannot drop below a certain minimum voltage value. The voltage-adjusting stage does not need to be constructed with a potentiometer as is the case in the circuit arrangement shown. Such a voltage-adjusting stage can also comprise, for example, a direct voltage amplifier which is constructed as integrator with virtually infinitely large time constant and the input voltage of which can be adjusted between a predetermined direct-voltage potential and a reference potential by means of, for example, two touch controls and which emits at its output an output voltage corresponding to the set input voltage as direct control voltage. Additionally, such a voltage-adjusting stage can also comprise a digital/analog converter circuit which generates, in dependence on a digital signal supplied to it by means of a remote control device, a direct voltage value which it emits as direct control voltage.

The amplifier circuit 14 is formed in a particularly simple and advantageous manner by a CMOS inverter which is shown diagrammatically in the FIGURE and which exhibits a signal input 19, a signal output 20 and a supply voltage connection 21. The CMOS inverter 14 contains in familiar manner two complementary MOS field effect transistors 22 and 23, shown in the FIGURE, and protective resistors and protective diodes, not shown. For example, to implement such a CMOS inverter, a CMOS inverter chip, which is produced by Philips and is commercially available under the type designation PC74HCU04, can be used which contains six such CMOS inverters.

The signal output 20 and the signal input 19 of the CMOS inverter 14 are connected to one another via a feedback resistor 24 by means of which the operating point of the CMOS inverter 14 is determined. The signal input 19 is preceded by a series resistor 25 which, together with the feedback resistor 24 determines the gain of the CMOS inverter 14. The series resistor 25 is connected to the input connection 2 or 4, respectively, via a capacitor 26 for direct-current isolation. The sound signal, the level of which is to be controlled, is supplied to the signal input 19 of the CMOS inverter 14 via the series resistor 25. The level-controlled sound signal is picked up from the signal output 20 of the CMOS inverter 14. The signal output 20 is connected to a load resistor 28 via a capacitor 27 for direct-current isolation. The voltage drop across the load resistor 28 is supplied to the output stage amplifier 7 and 9 via the output connection 6 and 8, respectively.

The supply voltage connection 21 of the CMOS inverter 14 is supplied with the variable direct control voltage, generated by means of the voltage-adjusting stage 15 and occurring at its output 16, as supply voltage for the CMOS inverter 14 via an electrically conductive connection 29. In dependence on the direct control voltage supplied to the supply voltage connection 21, the CMOS inverter 14 is operated below the knee-point voltage in its starting region in which the gain of the CMOS inverter 14 decreases, and additionally the dynamic output impedance of the CMOS inverter 14 increases, with decreasing direct control voltage.

For the aforementioned case where the CMOS inverter 14 is implemented with the aid of the CMOS inverter chip PC74HCU04, the following must be noted with respect to the choice of magnitude of the supply voltage for this CMOS inverter. The PC74HCU04 chip is provided for a voltage supply with a supply voltage of usually between 2 and 6 volts. With such a voltage supply, each of the CMOS inverters contained in this chip is operated in its pinch-off region above the knee-point voltage. To operate such a CMOS inverter in its starting region below the knee-point voltage as is intended to be the case in the present circuit arrangement, the supply voltage supplied, which is formed by the direct control voltage generated by means of the voltage-adjusting stage 15, is selected to be correspondingly lower. In practice, it has been found to be appropriate in this connection if the direct control voltage is set to a maximum of about 1.7 volts. To adjust the level of a sound signal, the direct control voltage is varied between this value of 1.7 volts and a value of about 0.8 volts with the aid of the potentiometer 17. Because of the low-end resistor 18, the direct control voltage cannot drop below 0.8 volts. Provision of the low-end resistor 18 therefore has the result that the CMOS inverter 14 is supplied with a particular minimum voltage as supply voltage by means of which it is ensured that the CMOS inverter 14 operates correctly as amplifier. Should the supply voltage for the CMOS inverter 14, that is to say the direct control voltage supplied to it, drop below the aforementioned minimum value of about 0.8 volts, the CMOS inverter 14 would then stop its proper operation altogether which, however, is not permissible.

A capacitor 30 is connected to the connection 29 between the output 16 of the voltage-adjusting stage 15 and the supply voltage connection 21 of the CMOS inverter 14. In the present case, where the direct control voltage is applied to the supply voltage connections 21 of two CMOS inverters 14 in the two stereo channels 10 and 11 via the connection 29, this capacitor 30 is provided for the purpose of suppressing any interaction between the two CMOS inverters 14 connected to one another With their supply voltage connections 21 via the connection 29.

By operating the CMOS inverter 14, which is provided as amplifier circuit, below the knee-point voltage in its starting region, both the gain of the CMOS inverter 14 and the dynamic output impedance of the CMOS inverter 14 is changed in the present circuit arrangement 12 or 13 for the electronic level control or level adjustment, respectively, of a sound signal in dependence on the variable direct control voltage which is supplied to the CMOS inverter 14 as supply voltage, in such a manner that when the direct control voltage decreases, the gain also decreases but the dynamic output impedance increases. The dynamic output impedance of the CMOS inverter 14 forms, together with the load resistor 28 connected to the signal output 20, a voltage divider for the level-controlled sound signal. Due to the changing voltage divider ratio, this voltage divider supplies a sound signal the level of which decreases with decreasing direct control voltage and consequently rising dynamic output impedance. Furthermore, the CMOS inverter 14 also supplies a sound signal the level of which decreases with decreasing direct control voltage due to the fact that the gain decreases with decreasing direct control voltage. Thus, two effects which are superimposed in the same direction are influential in the control of the level of a sound signal, namely the change in the gain of the CMOS inverter 14 which is directly proportional to the change in the direct control voltage supply to the CMOS inverter, and the change in the dynamic output impedance of the CMOS inverter 14 which is inversely proportional to the change of the direct control voltage supplied to the CMOS inverter. In this manner, a relatively wide adjustment range in the electronic control or adjustment, respectively, of the level of a sound signal is achieved with only a single CMOS inverter which is operated below the knee-point voltage in its starting region. Due to the characteristics of a CMOS inverter in its starting region, the direct control voltage can be changed within a relatively wide range for controlling the level of a sound signal, for example when the CMOS inverter chip PC74HCU04 is used within a range of between about 1.7 volts and about 0.8 volts, that is to say within a range of about 0.9 volts which is advantageous with respect to a low influence of tolerances and thermal influences on the adjustment characteristic. Operating the CMOS inverter below the knee-point voltage in its starting range furthermore has the advantageous result that sufficiency is found with low direct control voltages which are supplied to the CMOS inverter as supply voltage, and that only very small currents occur. If the CMOS inverter chip PC74HCU04 is used, the direct control voltage is below about 1.7 volts and currents of the order of magnitude of only a few to 100 μA occur. A further advantage of using a CMOS inverter which is operated below the knee-point voltage in its starting region consists in the fact that a linear change in the direct control voltage results in a logarithmic change in the output signal of the CMOS inverter, that is to say in the level-controlled sound signal, as is desirable for correct loudness control matched to the logarithmic auditory sensitivity of the ear. Furthermore, due to the low tolerance- and temperature-dependence of such CMOS inverters, the same adjustment characteristic over the entire adjustment range, that is to say good tracking, is obtained for both stereo channels in the present circuit arrangement for level control or level adjustment, respectively, of a stereo sound signal in which such a CMOS inverter is provided in each of the two stereo channels.

In the circuit arrangement 12 or 13, respectively, a dynamic impedance 34, which is essentially formed by two series-connected diodes 32 and 33 and the impedance value of which can be controlled, is connected to the connection 31 between the series resistor 25 and the signal input 19 of the CMOS inverter 14. In this arrangement, the connection 31 between the series resistor 25 and the signal input 19 of the CMOS inverter is connected to the connection 35 between the two diodes 32 and 33 of the dynamic impedance 34. The dynamic impedance 34 formed by the two diodes 32 and 33 forms, together with the series resistor 25, a voltage divider for the sound signal, the level of which is to be controlled, which is supplied to the CMOS inverter 14. From the diode 32, the anode is connected via a series resistor 36 to the supply voltage connection +V and from the other diode 33, the cathode is connected via a further series resistor 37 to the output 16 of the voltage-adjusting stage 15 via the connection 29. In this manner, the variable direct control voltage generated by means of the voltage-adjusting stage 15 is supplied via the series resistor 37 to the dynamic impedance 34 formed by the two diodes 32 and 33, at the cathode of the diode 33 for controlling the impedance value of the dynamic impedance 34, the impedance value of the dynamic impedance 34 decreasing with decreasing direct control voltage. In this manner, the voltage divider ratio between the series resistor 25 and the dynamic impedance 34, the impedance value of which can be controlled and which is formed by the two diodes 32 and 33, is changed with decreasing direct control voltage in such a manner that a decrease in the level of the sound signal supplied to the signal input 19 of the CMOS inverter 14 is achieved.

Thus, an additional effect for controlling the level of a sound signal is obtained by means of the dynamic impedance 34, which effect is superimposed in the same direction on the two aforementioned effects, namely the decrease in gain and the increase in dynamic output impedance of the CMOS inverter 14 with decreasing direct control voltage, as a result of which the adjustment range in the electronic control or adjustment, respectively, of the level of a sound signal is further increased. Due to the provision of the dynamic impedance 34, overdriving of the CMOS inverter 14 with decreasing direct control voltage which is supplied as supply voltage for the CMOS inverter to its supply voltage connection, is additionally prevented. By providing two such series-connected diodes as a dynamic impedance, the advantageous result is obtained that the dynamic impedance remains essentially constant independently of the signal amplitude of the sound signal present at the diodes.

The connection 31 between the series resistor 25 and the signal input 19 of the CMOS inverter 14 and the connection 35 between the two diodes 32 and 33 of the dynamic impedance 34 are connected via a capacitor 38. Together with the series resistor 25, the capacitor 38 forms a high-pass filter 39 via which mid-range and treble signal components of a sound signal, the level of which is to be controlled, are supplied to the dynamic impedance 34 for damping these signal components. The cut-off frequency of this high-pass filter 39 in this arrangement is selected at about 300 Hz. At low volumes—which exist when the direct control voltage at the output 16 of the voltage-adjusting stage 15 is set to low voltage values, when the dynamic impedance 34 then exhibits a low impedance value—the mid-range and treble signal components bypassed via the high-pass filter 39 are bypassed via the dynamic impedance 34, due to its low value, via the series resistor 36 to the supply voltage connection +V and via the series resistor 37 and the capacitor 30 to ground, as a result of which the mid-range and treble signal components are lowered compared with the bass signal components which are not bypassed. This corresponds to a relative raising of the bass signal components compared with the mid-range and treble signal components at low volumes. At high volumes—which exist when the direct control voltage at the output 16 of the voltage-adjusting stage 15 is set to high voltage values when the dynamic impedance 34 then exhibits a high impedance value—there is virtually no bypassing of mid-range and treble signal components via the dynamic impedance 34 due to its high value so that there is no relative raising of the bass signal components compared with the mid-range and treble signal components at high volumes. In this manner, a good physiological loudness control is obtained with respect to bass signal components.

Furthermore, the connection of the series resistor 25 facing away from the signal input 19 of the CMOS inverter 14, which is connected to the isolating capacitor 26, is connected to one connection of a further high-pass filter 40, the other connection of which is connected to the diode 33 of the dynamic impedance 34 at the cathode of the diode 33. The further high-pass filter 40 consists of a capacitor 41 and a resistor 42 which is connected in series with the latter. The cut-off frequency of this further high-pass filter 40 is selected to be about 3 kHz. Treble signal components of a sound signal, the level of which is to be controlled are additionally supplied to the signal input 19 of the CMOS inverter 14 for raising these treble signal components via the further high-pass filter 40 and the diode 33, connected to the latter, of the dynamic impedance 34 and the capacitor 38 provided between the connection 35 between the two diodes 32 and 33 and the connection 31 between the series resistor 25 and the signal input 19 of the CMOS inverter 14. At low volumes—which exist when the direct control voltage at the output 16 of the voltage-adjusting stage 15 is set to low voltage values, when the dynamic impedance 34 exhibits a low impedance value—treble signal components are additionally supplied to the signal input 19 via the high-pass filter 40, the diode 33 which then has a low impedance value, and the capacitor 38 which results in a raising of these treble signal components at low volumes. At high volumes—which exist when the direct control voltage at the output 16 of the voltage-adjusting stage 15 is set to high voltage values, when the dynamic impedance 34 exhibits a high impedance value—there is virtually no additional supply of treble signal components to the signal input 19 of the CMOS inverter 14 due to the high impedance value of the diode 33 so that there is no raising of the treble signal components at high volumes. In this manner, a raising of the treble signal components of a sound signal, the level of which is to be controlled, is also achieved at low volumes in addition to the aforementioned raising of the bass signal components, as a result of which a particularly good physiological loudness control is obtained. It should be mentioned that the further high-pass filter 40 could also be connected to the other diode 32 of the dynamic impedance 34 at the anode of the diode 32 which would result in the same advantageous effect. The further high-pass filter 40 could also be connected via one further resistor each to the two diodes 32 and 33 of the dynamic impedance 34 at the connections of the diodes facing away from the connection 35 between the two diodes 32 and 33 which would also result in the same advantageous effect.

I claim:

1. A circuit arrangement for the electronic level control of a sound signal comprising an amplifier circuit which is inserted into a sound signal path and the gain of said amplifier circuit being controlled independence on a variable direct control voltage, and a voltage-adjusting stage for generating the variable direct control voltage, the variable direct control voltage generated being supplied to the amplifier circuit for controlling its gain, characterized in that the amplifier circuit is formed by a CMOS inverter having a signal input, a signal output and a supply voltage connection, the signal input of the amplifier circuit being coupled to a series resistor for supplying the sound signal, the level of which sound signal is to be controlled, at the signal output of the amplifier circuit a level-controlled sound signal being generated, and the supply voltage connection of the amplifier circuit being supplied with the variable direct control voltage, generated by means of the voltage-adjusting stage, as a supply voltage for the CMOS inverter, and means for operating the CMOS inverter in dependence on the direct control voltage supplied to the supply voltage connection, such that the gain of the CMOS inverter decreases and a dynamic output impedance of the CMOS inverter increases with decreasing direct control voltage.

2. A circuit arrangement according to claim 1, characterized in that a dynamic impedance, which is formed by two series-connected diodes, the impedance value of the two diodes being controllable, the connection between the series resistor and the signal input of the CMOS inverter being coupled to the connection between the two diodes of the dynamic impedance through a capacitor, a combination of the series resistor, the capacitor and the two diodes forms a voltage divider for the sound signal, the level of which sound signal is to be controlled, and which sound signal is supplied to the CMOS inverter, and in that the variable direct control voltage generated by means of the voltage-adjusting stage is supplied at a connection to a selected one of said two diodes at a point remote from said connection between the two diodes, for controlling the impedance value of the dynamic impedance, such that the impedance value of the dynamic impedance formed by the two diodes decreases with decreasing direct control voltage.

3. A circuit arrangement according to claim 1, characterized in that the connection between the series resistor and the signal input of the CMOS inverter and the connection between the two diodes of the dynamic impedance are connected via a capacitor, a combination of the capacitor and the series resistor forms a high-pass filter, where mid-range and treble signal components of a sound signal, the level of which sound signal is to be controlled, are supplied to the dynamic impedance for damping these signal components.

4. A circuit arrangement according to claim 3, characterized in that a connection to the side of the series resistor away from the signal input of the CMOS inverter is connected to a connection of a further high-pass filter being connected to at least one diode of the dynamic impedance at a connection of the diode facing away from the connection between the two diodes, such that the treble signal components of a sound signal, the level of which sound signal is to be controlled, are additionally supplied to the signal input of the CMOS inverter for raising these treble signal components, with partial bypassing of the series resistor via the further high-pass filter and the diode of the dynamic impedance connected to the further high-pass filter and the capacitor provided between a mid-point of the two diodes and a mid-point between the series resistor and the signal input of the CMOS inverter.

* * * * *